United States Patent [19]

Endo et al.

[11] Patent Number: 4,764,814
[45] Date of Patent: Aug. 16, 1988

[54] SOLID-STATE IMAGING DEVICE WITH RESET PULSE SELECTOR

[75] Inventors: Yukio Endo, Yokohama; Yoshitaka Egawa, Tokyo; Nozomu Harada, Yokohama, all of Japan

[73] Assignee: Kabushiki Kaisha Toshiba, Kawasaki, Japan

[21] Appl. No.: 65,766

[22] Filed: Jun. 24, 1987

[30] Foreign Application Priority Data

Jun. 30, 1986 [JP] Japan .................. 61-151591

[51] Int. Cl.$^4$ ............................................. H04N 3/14
[52] U.S. Cl. ........................... 358/213.18; 358/213.26
[58] Field of Search ................ 358/213.26, 213.18, 358/221, 167; 357/24 LR, 57, 213.15, 213.31

[56] References Cited

U.S. PATENT DOCUMENTS

| | | | |
|---|---|---|---|
| 4,556,851 | 12/1985 | Levine | 358/213.18 |
| 4,567,525 | 1/1986 | Endo et al. | 358/213.26 |
| 4,644,287 | 2/1987 | Levine | 358/213.26 |
| 4,677,490 | 6/1987 | Levine | 358/213.26 |
| 4,680,637 | 7/1987 | Sugiki | 358/213.18 |
| 4,689,808 | 8/1987 | Moorman et al. | 358/213.18 |
| 4,698,686 | 10/1987 | Endo et al. | 358/213.26 |
| 4,719,512 | 1/1988 | Endo et al. | 358/213.26 |

FOREIGN PATENT DOCUMENTS 58-17787 2/1983 Japan .

Primary Examiner—Jin F. Ng
Assistant Examiner—Stephen Brinich
Attorney, Agent, or Firm—Oblon, Fisher, Spivak, McClelland & Maier

[57] ABSTRACT

A solid-state imaging device is disclosed, which includes a CCD image sensor having a detection section formed on a substrate at its output stage. The detection section receives a signal charge transferred from a photosensitive cell section, and generates an image voltage signal corresponding to the signal charge. The detection section has an electrically floating semiconductor diffusion layer formed in the substrate. A packet of signal charges from each picture element cell is temporarily stored in the diffusion layer. A reset section is provided to the output stage of the image sensor. The reset section has a reset drain layer so formed in the substrate as to be located near the diffusion layer and a reset gate for controlling flow of charges between the diffusion layer and the reset drain layer. The reset control unit is connected to the reset gate. The reset control unit applies a normal reset pulse signal to the reset gate in a vertical effective period of the image sensor. In a vertical blanking period of the image sensor, the reset control unit applies a reset pulse signal having a phase opposite to that of the normal reset pulse signal to the reset gate.

15 Claims, 5 Drawing Sheets

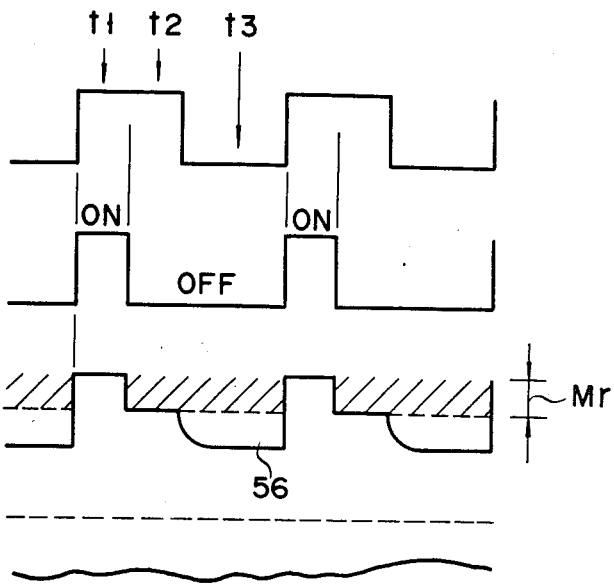
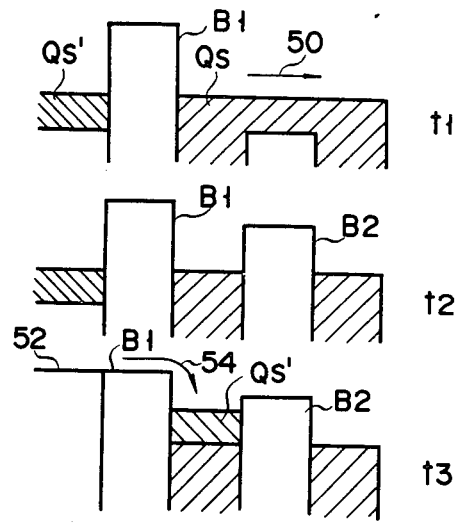

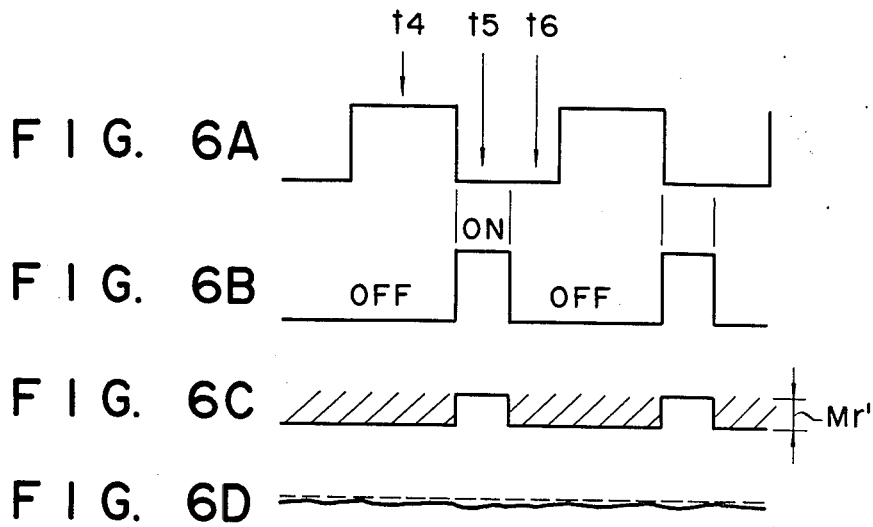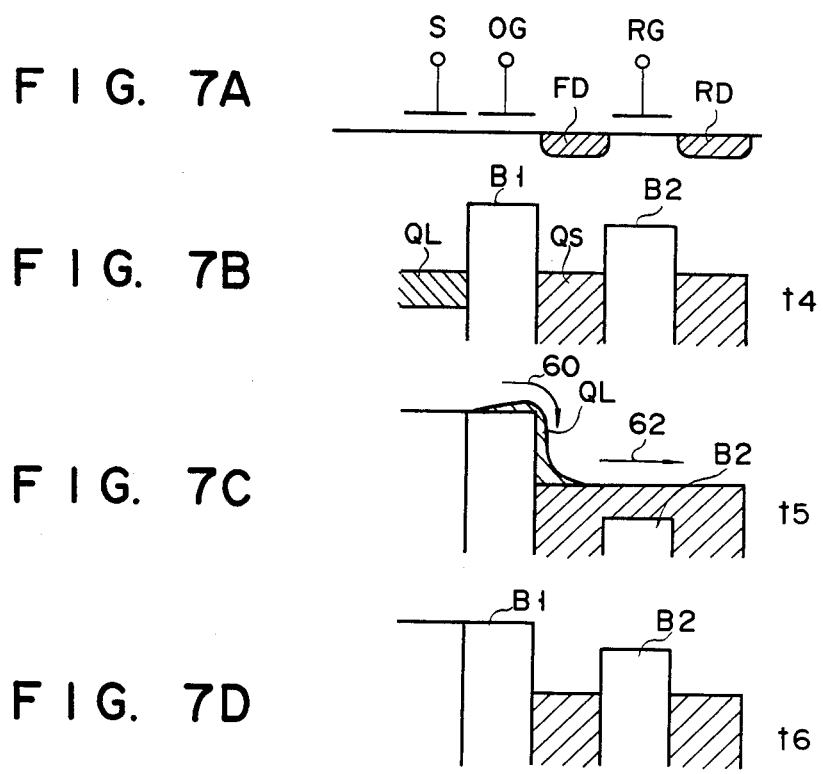

SOLID-STATE IMAGING DEVICE WITH RESET PULSE SELECTOR

BACKGROUND OF THE INVENTION

The present invention relates to an imaging device and, more particularly, to a method and device for driving a solid-state image sensor.

Recently, instead of conventional image pickup tube type image sensors, solid-state image sensors such as a charge-coupled device (CCD) and an MOS imaging element have been widely used in various technical applications such as an ITV camera and a video camera. In addition, a technique of laminating a photoconductive film on a photosensitive cell matrix section of a solid-state imaging element to obtain a highly sensitive image sensor has recently been noted by those skilled in the art. As compared with image pickup tube type image sensors, solid-state image sensors of these types are superior in size, weight, and operation reliability, and in terms of characteristics, they have an advantage of effectively suppressing image distortions, afterimages, and burnings. However, the solid-state image sensors have a problem of a "smear phenomenon". The smear phenomenon is a phenomenon in which excess carriers of signal charges, generated at a photosensitive cell matrix section in accordance with incidence of an optical image onto the image sensor, leak or mix with each other between adjacent cells of an array of photosensitive cells while they are transferred in a transfer section, thereby degrading the quality of a reproduced image.

In order to suppress or prevent the smear phenomenon, various sensor driving techniques have been proposed. For example, Japanese Patent Disclosure (Kokai) No. 58-17787 discloses a CCD image sensor, wherein excess carriers causing smear, generated in a vertical effective period of an image sensor for storing signal charges in accordance with incident image light, can be swept to an output section of a solid-state image sensor by applying a high-speed sweep pulse signal to a reset gate during a subsequent vertical blanking period, thereby suppressing the generation of smear. However, according to the image sensor operated in accordance with this driving method, in the vertical blanking period, an excessive output signal having a signal level several tens of times that of a normal image signal produced in the effective period is produced in the output section. Therefore, in order to accurately reproduce the excessive image output signal, a signal processor provided at an output stage of the image sensor must have a wide dynamic range. Furthermore, during a signal read operation in the next vertical effective period, a sag is generated in a sensor output signal due to the excessive sensor output signal, thereby posing another problem of degraded quality of a reproduced image.

Generally, in order to sweep the excess carriers to the output section of the image sensor in each vertical blanking period, a reset pulse having a constant phase (in-phase) is continuously applied to a reset gate throughout frame periods each consisting of the vertical blanking and vertical effective periods. In response to the application of the reset pulse signal, the excess carriers causing the smear are swept to a reset drain provided at the output stage of the image sensor in each vertical blanking period. Thus, the excessive sensor output signal including the excess carriers is produced in each vertical blanking period having no signal component. A signal processor for reproducing the excessive output signal must have a sufficiently wide dynamic range. A sag is generated in an image signal read out during the next vertical effective period. A sag in the output image signal generates vertical shading in a reproduced image, thereby degrading its quality.

According to another conventional driving method of reading a pixel signal, in order to sweep excess signal charges to the output section of the solid-state image sensor in each vertical blanking period, application of a reset pulse signal to the reset gate is completely stopped in only the vertical blanking period. According to this driving method, since the excess signal charges are directly swept to the reset drain of the image sensor in each vertical blanking period, no excessive sensor output signal is generated in an output terminal of the sensor. However, also in this case, a sag is generated in the image signal read out during the next vertical effective period. On the contrary, the generated sag has a level higher than that in the case of the above-mentioned driving method. This is because the reset pulse applied to the reset gate during the vertical blanking period is not at all mixed in the sensor output signal leaked through a stray capacitance (i.e., cut off), and a difference between a sensor output signal level obtained in the vertical blanking period and that including a mixed component of the reset pulse and obtained in the effective period is increased.

SUMMARY OF THE INVENTION

It is therefore an object of the present invention to provide a new and improved solid-state image sensor capable of improving basic imaging characteristics.

It is another object of the present invention to provide a new and improved solid-state image sensor capable of minimizing smear and sag without a signal processor having a wide dynamic range, so as to obtain a high quality reproduced image with a high signal-to-noise ratio, thereby improving the basic imaging characteristics.

In accordance with the above objects, the present invention is addressed to a specific solid-state imaging device, which includes a solid-state image sensor for generating signal charges in response to incident image light and generating an imaging signal from its output terminal. The image sensor comprises a photosensitive cell section, formed on a substrate so as to have pixel cells, for photoelectrically generating signal charges, a shift register section for transferring the signal charges, and a detection section, formed on the substrate so as to be coupled to the shift register section, for receiving the signal charges transferred from the photosensitive cell section to generate an image voltage signal corresponding thereto. The detection section includes an electrically floating semiconductor diffusion layer formed in the substrate and connected to the output terminal described above. A packet or signal charges from each pixel cell is temporarily stored in the diffusion layer. The Image sensor further comprises at its output stage a reset section including a reset drain layer formed in the substrate near the diffusion layer and a reset gate for controlling the flow of charges between the diffusion and reset drain layers.

The reset control unit is connected to the reset gate and supplies a normal reset pulse signal to the reset gate as a first reset pulse signal in the vertical effective period of the image sensor. In the vertical blanking period of the image sensor, the reset control unit supplies a reset pulse signal of an opposite phase with respect to the normal reset pulse signal as a second reset pulse signal to the reset gate, thereby sweeping the excess carriers to the reset drain in the vertical blanking period. In this case, in the vertical effective and vertical blanking periods, substantially the same amount of reset pulse signal is mixed in an imaging signal obtained from the output terminal of the image sensor. Therefore, a sag in the imaging signal can be minimized. Thus, the above objects of the present invention can be achieved.

The present invention and its objects and advantages will become more apparent in a detailed description of a preferred embodiment to be presented below.

BRIEF DESCRIPTION OF THE DRAWINGS

In the detailed description of a preferred embodiment of the invention presented below, reference is made to the accompanying drawings of which:

FIGS. 4A to 4D are detailed diagrams showing waveforms of electrical signals produced in the main part of the image sensor in a vertical effective period;

FIGS. 5A to 5D are diagrams illustrating for the sake of easy understanding how a packet of signal charges is transferred at an output section of the image sensor in the vertical effective period, wherein FIG. 5A shows a cross-sectional structure of the output section of the image sensor, and FIGS. 5B to 5D schematically show carrier storage states at the main part of the output section at three different times in the vertical effective period, respectively;

FIGS. 6A to 6D are diagrams showing in detail waveforms of electrical signals produced in the main part of the image sensor in a vertical blanking period; and FIGS. 7A to 7D are diagrams illustrating for the sake of easy understanding how a packet of signal charges is transferred at the output section of the image sensor in the vertical blanking period, wherein FIG. 7A shows a cross-sectional structure of the output section of the image sensor, and FIGS. 7B to 7D schematically show carrier storage states at the main part of the output section at three different times in the vertical blanking period, respectively.

DETAILED DESCRIPTION OF THE PREFERRED EMBODIMENT

Figure 1:
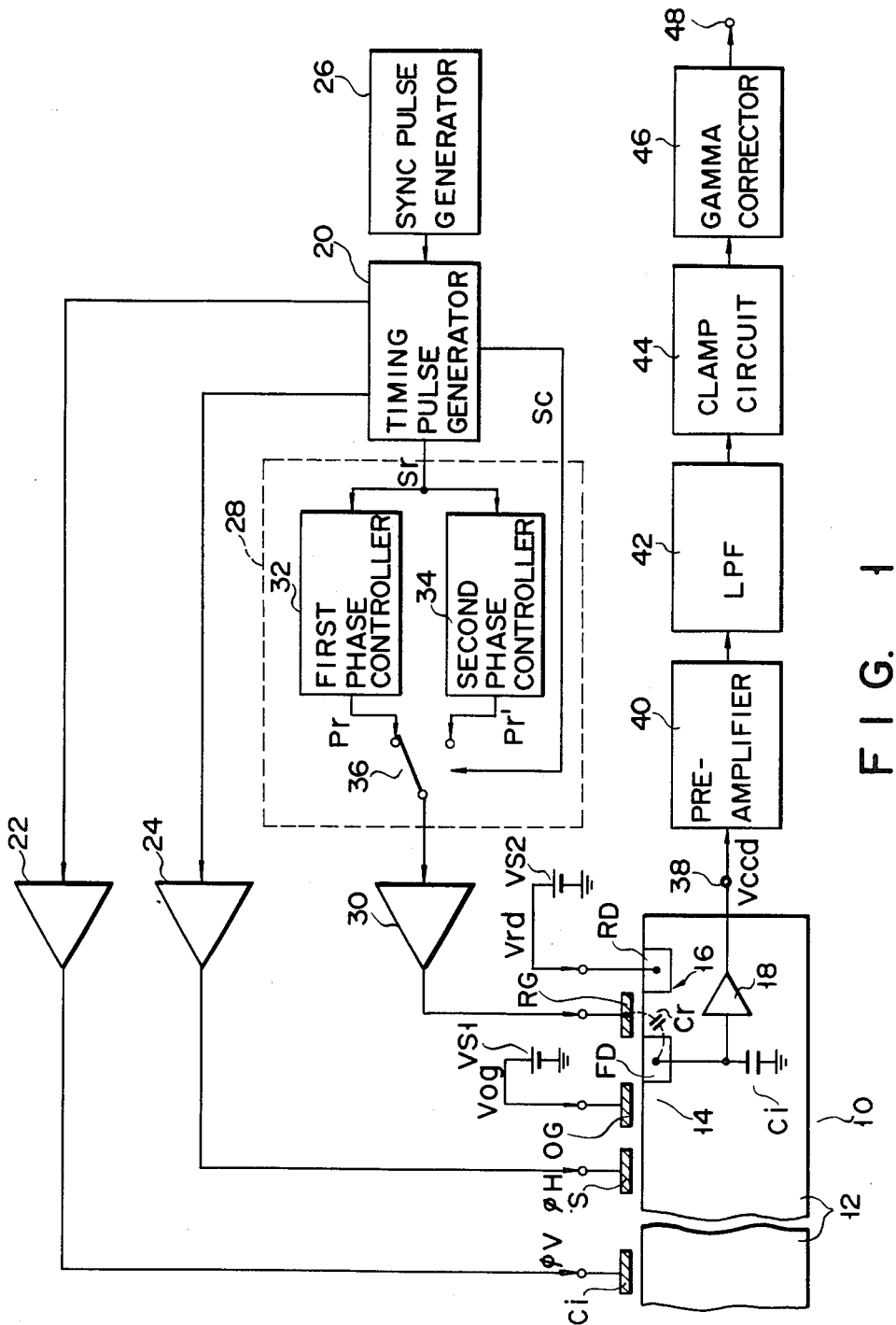
FIG. 1 is a diagram showing a main circuit arrangement of an imaging device according to a preferred embodiment of the present invention.

Referring now to FIG. 1 of the drawings, a monochrome TV camera using a solid-state image sensor, such as an n-channel type charge-coupled device (CCD) 10, is disclosed as one preferred embodiment of the invention. In this embodiment, interline-transfer type CCD (referred to as "IT-CCD" hereinafter) is used for the CCD image sensor 10.

Figure 2:
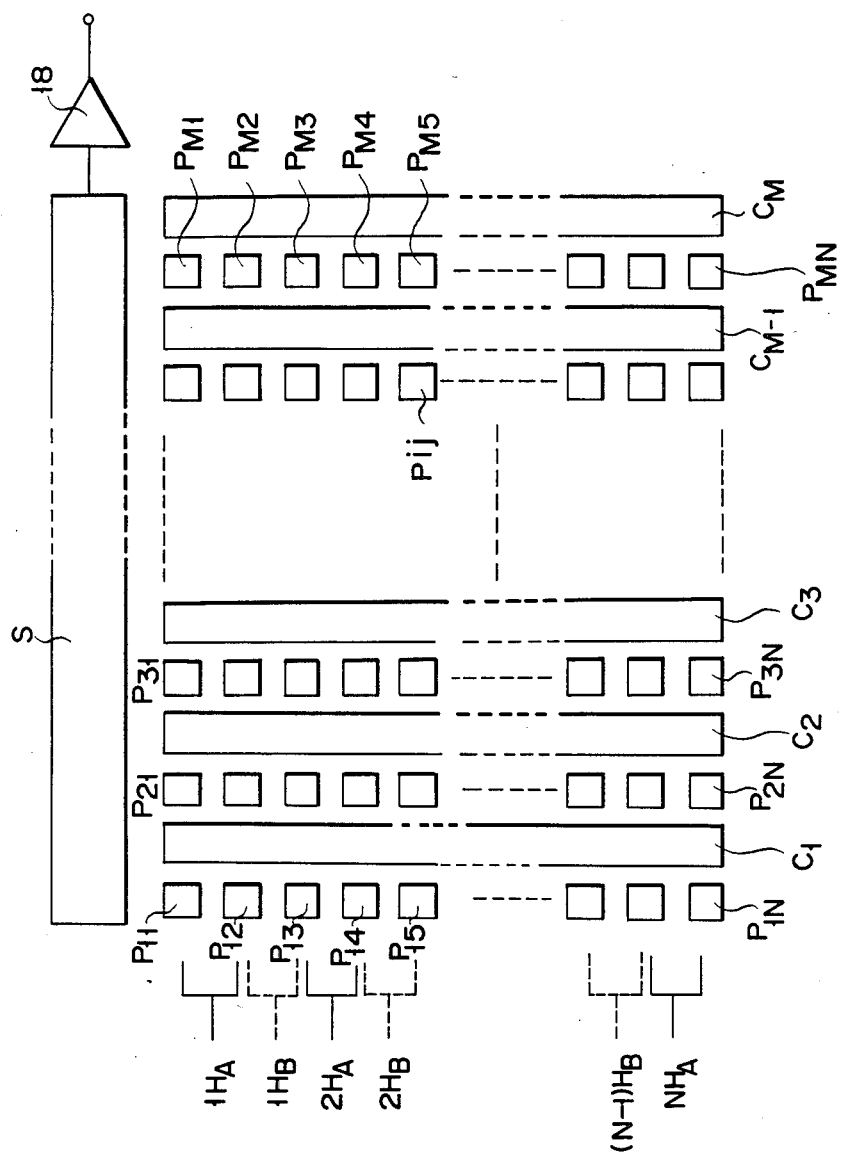
FIG. 2 is a plan view showing a main part including a photosensitive cell matrix of a CCD image sensor used in the imaging device shown in FIG. 1.

IT-CCD 10 has a silicon substrate 12 on which a photosensitive section is formed which has N×M photodiodes P11, F12, ..., Pij, ..., PMN (N=500 and M=400, for example). Photodiodes F are arranged in a matrix form as shown in FIG. 2, which is well known among those skilled in the art. Such a photosensitive cell arrangement is also disclosed in U.S. Pat. No. 4,567,525 (corresponding EPC patent application Ser. No. 84112395.3 filed in Oct. 13, 1984). The M units of vertical CCD transfer sections C1, C2 ..., CM are arranged adjacent to M lines of photodiodes P1, P2, .., P1. Vertical CCD transfer sections C1, C2, ..., CM are coupled to a horizontal CCD shift register S at the final transferring stages thereof. When a pulse voltage signal, or a gate control signal, is supplied to CCD image sensor 10, signal carriers stored in photodiodes F due to the incident optical image are transferred to vertical CCD transfer sections C1, C2, ..., CM and further successively transferred to horizontal CCD shift register S. Such a circuit arrangement may be fabricated on silicon substrate 12 (shown in FIG. 1) by existing integrated circuit fabricating technology.

In FIG. 1, the image signal output section of IT-CCD 10 is illustrated to have a specific layer structure which is known as a "floating diffusion type structure" in this technical field. One vertical CCD transfer section Ci and horizontal CCD shift register S are also shown in the sectional view of FIG. 1. The CCD output section is comprised of detector section 14 and reset section 16. Detector section 14 includes output gate electrode OG insulatively provided above silicon substrate 12, and electrically floating diffusion layer FD. Reset section 16 has reset gate electrode RG and reset drain region RD serving to discharge signal carriers from diffusion layer FD. Output stage amplifier (on-chip amplifier) 18 is formed on substrate 12 and comprised of metal-oxide semiconductor field effect transistor (MOSFET), which is not shown in FIG. 1.

Signal carriers photoelectrically converted in the photosensing section are driven, in response to output gate voltage Vog, which is supplied by first DC voltage source VS1 to output gate electrode OG, such that they jump over a potential barrier formed in substrate 12 and flow into diffusion layer FD forming a signal detecting diode. A voltage potential of diffusion layer FD is reset to drain voltage Vrd, prepared by second DC voltage source VS2, in synchronism with the periods of a reset pulse signal (Pr or Pr') supplied to reset gate electrode RG. The signal charges temporarily stored in layer FD are converted to an image signal voltage by total capacitance Ci as given by the sum of the capacitance components of diffusion layer FD and amplifier 18. Capacitor Ci represents a stray capacitance between layer FD and reset gate electrode RG, through which the reset pulse signal is partially mixed into the CCD output signal of image sensor 10.

Timing pulse generating circuit 20 is provided to produce charge-transfer drive pulse signals $\phi V$ and $\phi H$, which are supplied via CCD drivers 22 and 24 to electrodes of vertical CCD transfer section Ci and horizontal CCD shift register S. Drive pulse signal $\phi V$ has a potential level which is time-sequentially and periodically changed among preset levels to transfer the signal charges in each of CCD transfer sections C1, C2, ..., CM. Drive pulse signal $\phi H$ has a multi-potential level which is also time-sequentially and periodically changed to thereby transfer the signal charges in horizontal CCD shift register S. Sync signal generating circuit 26 is connected to timing pulse generator 20, for supplying a sync clock signal in synchronism with which the drive signals $\phi V$ and $\phi H$ are produced.

Timing pulse generator 20 is connected via reset pulse control circuit 28 and reset driver 30 to reset gate electrode RG which is provided in the output section of image sensor 10. Reset pulse control circuit 28 includes two parallel phase controllers 32 and 34. Timing pulse generator 20 generates reference reset pulse signal Sr, which is supplied to parallel phase controllers 32 and 34. Phase controllers 32 and 34 generate reset pulse signals Pr and Pr', the pulse phases of which are shifted from each other by 180 degrees (phase angle difference of $\pi$). In other words, the output pulse signal Pr' of phase controller 34 is a reverse-phase pulse signal of normal pulse signal Pr that phase controller 32 generates, while both output pulse signals are the same as each other in voltage pulse amplitude, pulse frequency and pulse duty ratio. In this embodiment, first phase controller 32 is a reset pulse generator for producing a normal reset pulse signal Pr of a suitable pulse amplitude based on the output signal Sr of timing pulse generator 20. Second phase controller 34 includes a phase-shift circuit (not shown) for producing a reverse-phased reset pulse signal Pr' having a waveform which is the same in pulse amplitude and frequency as normal reset pulse signal Pr and defines the phase angle difference of 180 degrees between itself and normal reset pulse signal Pr.

Reset pulse selector 36 is connected to the outputs of parallel phase controller 32 and 34. Selector 36 includes an analog switch element, which may be a known switching transistor such as a MOSFET. In FIG. 2, for facilitating the visual understanding of the illustration, signal selector 36 is illustrated as if it is a double-throw mechanical switch having two input contacts connected to the outputs of phase controllers 32 and 34 and an output connected to reset pulse driver 30. This signal selector 36 performs a switching operation in response to control pulse signal Sc supplied thereto from timing pulse generator 20. More specifically, signal selector 36 is driven in the vertical effective period Te of image sensor 10 such that it switches to a first electrical condition in which the output pulse signal of first phase controller 32, that is, normal reset pulse signal Pr is allowed to be supplied to reset gate RG via driver 30. On the other hand, in the vertical blanking period Tb of image sensor 10, signal selector 36 is driven to switch and present a second electrical condition wherein the output pulse signal of second phase controller 34, that is, reverse-phased reset pulse signal Pr' is then supplied to reset gate RG of image sensor 10 via reset pulse driver 30.

On-chip amplifier 18 provided in the CCD output section is connected to output terminal 38 of CCD image sensor 10, which is further connected to pre-amplifier 40, low-pass filter (LPF) 42, clamp circuit 44 and gamma correcting circuit 46, as shown in FIG. 2. The CCD output voltage Vccd, which is voltage-converted by capacitors Ci and Cr, is supplied to pre-amplifier 40 via CCD output terminal 38 of low impedance, so that CCD output signal Vccd may be amplified to have a required voltage level of image pickup signal. Amplified CCD output voltage signal Vccd is then supplied to LPF 42 which has a suitably selected cutoff frequency for attenuating high-frequency components corresponding to reset pulse signal components which are mixed into CCD output voltage signal Vccd in the output section of image sensor 10, in order to eliminate the reset pulse components from CCD output signal Vccd. The output signal of LPF 42 is supplied to clamp circuit 44, which serves to reproduce the DC signal component of the CCD output image signal. The output signal of clamp circuit 44 is subjected to known kinds of signal processings required to display a pickup image on a display unit (not shown), such as gamma correction, adjustment of white-clip level, BL processing, and the like. The output signal of gamma corrector 46 is supplied to an externally provided display unit (not shown) via NTSC image signal output terminal 48.

Figures 3A, 3B, 3C, 3D, 3E, 3F:
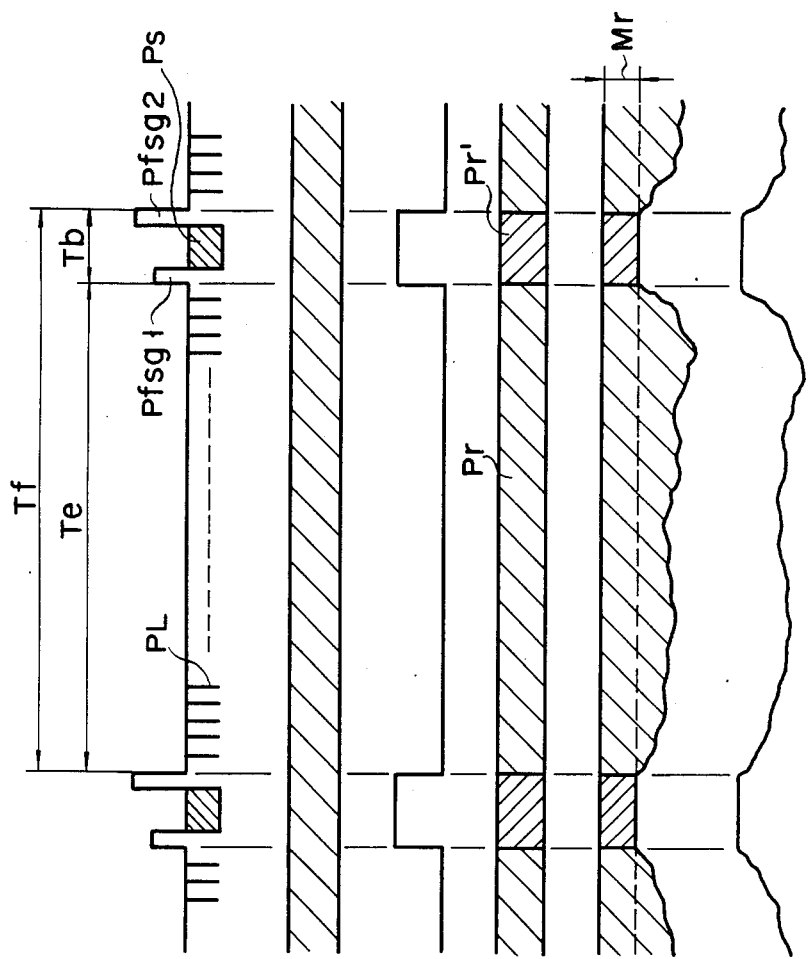
FIGS. 3A to 3F are diagrams showing waveforms of electrical signals produced in the main part of the image sensor.

An operation mode of the solid-state imaging device according to the embodiment of the present invention having the above arrangement will be described below in detail with reference to the signal waveforms shown in FIGS. 3A to 3F. FIG. 3A, reference symbol "Tb" denotes a vertical blanking period of image sensor 10; "Te", a vertical effective period thereof; and "Tf", one frame period thereof.

As shown in FIG. 3A, vertical transfer drive pulse signal $\phi V$ supplied to vertical transfer section Ci includes line pulses PL constantly generated in period Te, first field shift pulse Pfsg1 generated in synchronism with the beginning of period Tb, high-speed sweep pulses Ps (note: an interval between the pulses is so small that hatched lines are used in FIG. 3A) of a high frequency generated in period Tb, and second field shift pulse Pfsg2 generated in synchronism with the end of period Tb. In order to improve the characteristics of sensor 10, pulse Pfsg1 and pulses Ps are required for sweeping excess signal charges causing smear to reset drain RD. Throughout the entire frame period of a read operation of the signal charges, horizontal transfer drive pulse signals $\phi H$ having a constant pulse amplitude and pulse frequency are supplied to horizontal shift register S, as shown in FIG. 3B.

Reset pulse selector 36 of reset pulse controller 28 is applied with reset control pulse signal Sc having a high potential in period Tb and a low potential in period Te, as shown in FIG. 3C. Selector 36 is switched in response to signal Sc to (1) supply an output signal from first phase controller 32, i.e., normal reset pulse signal Pr to driver 30 in period Te, and (2) supply an output signal from second phase controller 34, i.e., reset pulse signal Pr' inverted to have a phase opposite to driver 30 in period Tb. In FIG. 3D, for facilitating the visual understanding of illustration, hatched lines in the opposite direction are used to represent that signals Pr and Pr' are in opposite phases from each other (i.e., phase angles are shifted from each other by 180°). By supplying such special reset pulse signals to reset gate RG of sensor 10, substantially the same amount or reset pulse component Mr is mixed in through capacitor Cr throughout periods Te and Tb in a CCD output signal obtained at the output section of sensor 10, as shown in FIG. 3E. Note that FIG. 3F shows a waveform of an output signal from low-pass filter 42.

In period Te of sensor 10, signal Pr generated by controller 32 is supplied to reset gate electrode RG through driver 30. A phase relationship between signals $\phi H$ and Pr in this period is clearly shown in enlarged views of signal waveforms of FIGS. 4A and 4B. As is apparent from FIG. 4A, a pulse duty ratio of signal $\phi H$ is "1:1", and its signal potential alternately changes between high and low potentials (to be referred to as level "H" and "L" hereinafter). Signal Pr has pulse components generated in synchronism with changes in signal $\phi H$ from level "H" to "L". A pulse duty ratio of signal Pr is smaller than that of signal $\phi H$.

FIG. 5A again shows the structure of the output section of sensor 10, and FIGS. 5B to 5D show, in correspondence to FIG. 5A, patterns of a charge transfer potential channel formed in substrate 12 at three different times t1, t2, and t3 in period Te. As described above, since DC voltage Vrd is applied to reset drain layer RD from voltage source VS2, a very deep potential well is formed in the substrate region immediately below layer RD.

At time t1, when signal φH has level "H", signal Pr also has level "H". Therefore, as shown in FIG. 5B, a deep potential well is formed in the substrate region located immediately below horizontal CCD shift register S and reset gate electrode RG. Therefore, the reset gate is opened, and floating diffusion layer FD is reset to drain RD. Signal charge Qs stored in layer FD is allowed to freely flow into drain RD, as represented by arrow "50" in FIG. 5B. At this time, a potential well located below electrode OG is shallow, and hence relatively high potential barrier B1 is present between register S and layer FD to inhibit inflow of the signal charges from register S to layer FD.

At time t2 in period Te, signal φH maintains level "H", and signal Pr changes to level "L". Therefore, as shown in FIG. 5C, a potential well in the substrate region located below electrode RG becomes shallow to close the reset gate. That is, relatively high potential barrier B2 is present between layer FD and drain RD to inhibit movement of the signal charges from layer FD to drain RD. This state corresponds to a state wherein layer FD waits for the inflow of new signal charges.

At time t3 in period Te, both signals φH and Pr fall to level "L". A potential well below register S becomes shallow as represented by reference numeral "52" in FIG. 5D. Therefore, new signal charge Qs' jumps over barrier B1 below gate OG (see arrow "54" in FIG. 5D) while gate RG is closed, flows into layer FD, and is stored therein.

The above-mentioned signal charge read operation in period Te will be summarized below. The reset gate is opened and layer FD is reset to drain RD while a packet of signal charges representing a pixel signal which is photoelectrically converted at a given photosensitive cell is stored in layer FD. At this time, excess carriers may be swept into drain RD. When a packet of next signal charges is stored in layer FD through gate OG, gate OG is closed. Therefore, at this time, the excess carriers are prevented from being swept or exhausted into drain RD. As a result, CCD output signal Vccd obtained from output terminal 38 (see FIG. 1) of sensor 10 has effective pixel signal component 56 produced only in a period (including time t3) wherein both signals φH and Pr fall to level "L", as shown in FIG. 4C. Component 56 corresponds to packet Qs' of the signal charge shown in FIG. 5D. Mixed component Mr of signal Pr is uniformly included in the CCD output signal throughout the entire period except the period (including time t1) wherein both signals φH and Pr rise to level "H". When the CCD output signal shown in FIG. 4C is subjected to the processing of removing component Mr of signal Pr by filter 42 shown in FIG. 1, a pure image signal shown in FIG. 4D can be obtained.

In period Tb, selector 36 of controller 28 disconnects first phase controller 32 and connects second phase controller 34 in response to control signal Sc from timing pulse generator 20. Therefore, in period Tb, an output signal from controller 34, i.e., reverse-phased reset pulse signal Pr', is supplied to gate RG. FIGS. 6A and 6B clearly show a phase relationship between signals φH and Pr' in period Tb. A pulse waveform of signal φH shown in FIG. 6A is similar to that of signal φH shown in FIG. 4A. Contrary to the case shown in FIG. 4B described above, signal Pr' shown in FIG. 6B has pulse components generated in synchronism with a change in signal φH from "H" to "L" levels. A pulse duty ratio of signal Pr' is the same as that of normal reset pulse signal Pr.

FIG. 7A again shows the structure of the output section of sensor 10, and FIGS. 7B to 7D show patterns of a charge transfer potential channel formed in substrate 12 at three different times t4, t5, and t6 in period Tb in correspondence to FIG. 7A.

At time t4 in period Tb, signal Pr' maintains level "L" while signal φH maintains level "H", as shown in FIG. 6B. Therefore, at time t4, a deep potential well is formed in the substrate region located immediately below register S, and gate RG is closed, as shown in FIG. 7B. As a result, charges, if any, stored in layer FD are prevented from flowing into layer RD.

At time t5 in period Tb, signal φH falls from level "H" to level "L", and on the contrary, signal Pr' rises from level "L" to level "H". The potential well immediately below electrode S becomes shallow, and barrier B2 below gate RG is lowered to open gate RG. Layer FD is reset to drain RD. At this time, excessive signal charges transferred to register S, i.e., excess carriers QL causing smear are allowed to flow into layer FD as represented by arrow "60" in FIG. 7C, and to be exhausted to drain RD as represented by arrow "62" in FIG. 7C. That is, in period Tb, since gate RG is opened when carriers QL flow from register S into layer FD through gate OG, carriers QL flowing into layer FD are exhausted to layer RD at the same time.

At time t6 in period Te, both signals φH and Pr' fall to level "L". Therefore, gate RG is closed while the potential well immediately below electrode S remains shallow. At this time, draining of carriers QL is stopped.

As a result, in period Tb, signal Vccd obtained from terminal 38 (see FIG. 1) of sensor 10 contains component Mr' of signal Pr' mixed through capacitor Ci throughout the entire period except the period (including time t5) wherein signal Pr' rises to level "H", i.e., gate RG is opened, as shown in FIG. 6C. Therefore, the CCD output signal at that time does not contain the effective image signal component at all and hence consists only of component Mr' of signal Pr'. When the output signal CCD in FIG. 6C is subjected to processing of removing component Mr' of signal Pr' by filter 42, a signal waveform not containing a sag at all can be obained, as shown in FIG. 6D.

According to the solid-state image sensing device of the present invention, in order to sweep carriers QL causing smear into layer RD in period Tb subsequent to period Te, electrode RG is applied with signal Pr' having a phase completely opposite to that of signal Pr (i.e., phase angles are shifted from each other by 180°). Signal Pr' is completely the same as signal Pr in terms of frequency, pulse amplitude, and duty ratio, i.e., except the opposite pulse phase is subsequently supplied to gate RG also in period Tb. Therefore, the excess carriers can be effectively swept into drain RD. Like signal Vccd obtained in period Te, signal Vccd' obtained in period Tb can contain the mixed component (Mr') of signal Pr. Since the CCD output signals contain substantially the same amount of mixed component of the reset pulse signal throughout periods Te and Tb, a signal level difference between signals Vccd and Vccd' in periods Te and Tb can be reduced, thereby effectively preventing a sag. Therefore, a high quality image, free from a sag and having a high signal-to-noise ratio, can be sensed. In addition, with the above arrangement, since a signal processor with a wide dynamic range need not be used, an increase in cost of the image sensing device can be minimized.

Although the invention has been described with reference to a specific embodiment, it shall be understood by those skilled in the art that numerous modifications may be made that are within the spirit and scope of the inventive contribution.

For example, in the above embodiment, a description has been made with reference to a monochrome TV camera using one CCD imaging element. However, the present invention is not limited to the above embodiment, but can be applied to a 3-plate color camera using three CCD imaging elements. Especially in the case of a color camera, since a sag causes a coloring phenomenon, the present invention can be effectively applied. In addition, a description has been made with reference to an n-channel CCD in the above embodiment, but the present invention can be similarly applied to a p-channel CCD. In this case, the polarity of each pulse is reversed. Furthermore, in the above embodiment, a floating diffusion layer is used as a means for detecting a signal charge of the CCD imaging element. However, the present invention can be effectively applied to the case wherein a floating gate type signal charge detecting means is used.

What is claimed is:

1. An imaging device comprising:
   (a) solid-state image sensor means for sensing incident light and for generating an electrical image signal at its output terminal, said image sensor means comprising,
   a substrate,
   a semiconductor diffusion layer, formed in said substrate so as to be connected to said output terminal, for temporarily storing signal charges generated in accordance with radiation of the incident light and transferred thereto,
   a reset drain layer formed in said substrate so as to be located adjacent to said diffusion layer, and
   a reset gate for controlling a flow of charges between said diffusion layer and said reset drain layer; and
   (b) reset controlling means, connected to said reset gate, for supplying a reset pulse signal which has pulse phases different from each other in vertical effective and vertical blanking periods of said image sensor means.

2. The device according to claim 1, wherein said reset controlling means supplies a first reset pulse signal corresponding to a normal reset pulse signal to said reset gate in the vertical effective period, and supplies a second reset pulse signal with a phase opposite to that of the normal reset pulse signal to said reset gate in the vertical blanking period, thereby controlling said reset gate such that excess carriers flow into said diffusion layer and are simultaneously exhausted into said reset drain.

3. The device according to claim 2, wherein said reset controlling means generates, in the vertical effective period, the first reset pulse signal changing a signal level so as to open said reset gate at a time different from that at which the signal charge from a given pixel cell of a photosensitive section is stored in said diffusion layer, and generates, in the vertical blanking period, the second reset pulse signal changing a signal level so as to open said reset gate at the same time the signal charge from said photosensitive section flows into said diffusion layer.

4. The device according to claim 3, wherein the first and second reset pulse signals are the same in terms of pulse amplitude, frequency, and pulse duty ratio.

5. The device according to claim 4, wherein said reset controlling means comprises:
   first circuit means for constantly generating the first reset pulse signal;
   second circuit means, provided in parallel with said first circuit means, for constantly generating the second reset pulse signal; and
   switching means, connected to said first and second circuit means, for selectively generating the first and second reset pulse signals.

6. The device according to claim 5, wherein said switching means includes a transistor.

7. The device according to claim 5, further comprising:
   (c) filter circuit means, electrically connected to said output terminal, and having a cutoff frequency suitable for removing a mixed component of a reset pulse signal contained in a voltage signal generated at said output terminal in the vertical effective and vertical blanking periods.

8. A method of driving a solid-state imaging sensor for generating a signal charge therein in response to incident light and for generating an electrical imaging signal at its output terminal, said method comprising the steps of:
   (a) temporarily storing the signal charge generated in accordance with radiation of the incident light in a semiconductor diffusion layer formed in a substrate so as to be connected to said output terminal;
   (b) applying, in a vertical effective period of said image sensor, a normal reset pulse signal as a first reset pulse signal to a reset gate for controlling the flow of charges between said diffusion layer and a reset drain layer formed in said substrate so as to be located adjacent to said diffusion layer; and
   (c) applying, in a vertical blanking period of said image sensor, a reset pulse signal, having a phase opposite to that of the normal reset pulse signal, as a second pulse signal to said reset gate, whereby excess carriers flow into said diffusion layer and are simultaneously and directly exhausted into said reset drain layer in the vertical blanking period, and substantially the same amount of a mixed component of the reset pulse signal is contained in the imaging signal from said output terminal in the vertical effective and vertical blanking periods, thereby minimizing generation of a sag in the imaging signal.

9. The method according to claim 8, wherein said reset gate is driven in response to the first reset pulse signal so as to open said reset gate at a time different from that at which a packet of the signal charge from a given picture element cell of said image sensor is stored in said diffusion layer.

10. The method according to claim 9, wherein said diffusion layer is constantly applied with a DC power source voltage.

11. A solid-state imaging device comprising:
    (a) a charge coupled element having,
    a photosensitive cell section for generating a signal charge upon radiation of light, a shift register section for transferring the signal charge, a detection section, coupled to said shift register section, for receiving the signal charge transferred from said photosensitive cell section, and for generating a corresponding image voltage signal, said detection section including a floating semiconductor diffusion layer for temporarily storing the signal charge, and a reset section having a reset drain layer located adjacent to said diffusion layer and a reset gate for controlling a flow of charges from said diffusion layer to said reset drain layer;

(b) driving means, connected to said shift register section, for generating a charge transfer drive pulse signal, a potential of which changes in a pulse-like manner between a first potential and a second potential higher than the first potential, the drive pulse signal being supplied to said shift register section, and said shift register section shifting the signal charge therein and transferring it to said floating diffusion layer in response to the drive pulse signal; and (c) reset controlling means, connected to said reset gate, for applying a normal reset pulse signal to said reset gate in a vertical effective period of said image sensor means, and for applying an inverted reset pulse having a phase opposite to that of the normal reset pulse signal to said reset gate in a vertical blanking period of said image sensor means, wherein the normal reset pulse signal has a pulse component, generated every time the charge transfer drive pulse signal changes from the first to second potential level, thereby opening said reset gate, and the inverted reset pulse signal has a pulse component, generated every time the charge transfer drive pulse signal changes from the second to first potential level, thereby opening said reset gate, so that in the vertical blanking period, the packet of the signal charge flows into said diffusion layer and is simultaneously swept into said reset drain layer because said reset gate is opened.

12. The device according to claim 11, wherein each of the normal and inverted reset pulse signals has a pulse duty ratio smaller than that of the charge transfer drive pulse signal.

13. The device according to claim 12, wherein the normal and inverted reset pulse signals are the same in terms of pulse amplitude, frequency, and pulse duty ratio.

14. The device according to claim 13, wherein said reset controlling means comprises:

switching means for receiving the normal and inverted reset pulse signals, and for selectively outputting one of the reset pulse signals in synchronism with the vertical effective and vertical blanking periods.

15. The device according to claim 14, wherein said switching means comprises an analog switching element.

* * * * *